United States Patent
Lin

(10) Patent No.: US 7,382,655 B2
(45) Date of Patent: Jun. 3, 2008

(54) ACCESS TIME ADJUSTING CIRCUIT AND METHOD FOR NON-VOLATILE MEMORY

(75) Inventor: Gene Lin, Hsinchu (TW)

(73) Assignee: Solid State System Co., Ltd., Hsinchu (TW)

( * ) Notice: Subject to any disclaimer, the term of this patent is extended or adjusted under 35 U.S.C. 154(b) by 0 days.

(21) Appl. No.: 11/459,361

(22) Filed: Jul. 23, 2006

(65) Prior Publication Data
US 2008/0019209 A1    Jan. 24, 2008

(51) Int. Cl.
*G11C 16/32* (2006.01)
(52) U.S. Cl. .............................. 365/185.22; 365/185.09
(58) Field of Classification Search .......... 365/185.09, 365/185.17, 185.22, 189.07, 233
See application file for complete search history.

(56) References Cited

U.S. PATENT DOCUMENTS

| | | | |
|---|---|---|---|
| 5,257,221 A * | 10/1993 | Leak et al. | 365/53 |
| 6,285,621 B1 * | 9/2001 | Beer | 365/226 |
| 6,324,653 B1 * | 11/2001 | Lisart et al. | 713/600 |
| 6,519,716 B1 * | 2/2003 | Branstad | 714/36 |
| 2006/0174057 A1 * | 8/2006 | Chen et al. | 711/103 |

* cited by examiner

*Primary Examiner*—Andrew Q. Tran
(74) *Attorney, Agent, or Firm*—Jianq Chyun IP Office

(57) ABSTRACT

An access time adjusting circuit is used in a non-volatile memory to obtain an optimized access time in operation. The circuit includes an access time detecting unit, used to detect a performance status of the non-volatile memory under an operation clock and output the performance status. An access time controlling unit is used to generate at least one adjusting operation clock. Each adjusting operation clock serves as the operation clock for the non-volatile memory. In addition, the non-volatile memory, the access time controlling unit, and the access time detecting unit are connected to form a detection and adjustment loop, so that an optimized operation clock is determined after checking the at least one adjusting operation clock.

17 Claims, 3 Drawing Sheets

ACCESS TIME ADJUSTING CIRCUIT AND METHOD FOR NON-VOLATILE MEMORY

BACKGROUND OF THE INVENTION

1. Field of Invention

The present invention relates to technology for accessing a non-volatile memory. More particularly, the present invention relates to an accessing time adjustment for accessing a non-volatile memory.

2. Description of Related Art

Memory device in digital apparatus or digital is a necessary part. There are many kinds of non-volatile memory, such as NAND Type Flash devices, in the market for choice to the user. Taking the flash memory as the example, for different flash memory provider, the access time specification of the flash memory may be different. Even for the same Flash provider, although the Flash Access Time specification is the same, for the different Semiconductor Process, the "Real Acceptable Flash Access Time" has a lot of margin, compared to the timing rated in the specification. Even for the same Flash device, due to the operating voltage and thermal temperature variation, the Flash Access speed may be changed. In other words, for the mass production consideration with different process, voltage, temperature and some other factors, the Flash provider set the Flash Access Time specification in the lowest workable rate to guarantee some margins for these variations.

To speed up the Flash Access, performance is an important issue in many Flash Application such as DSC (Digital Still Camera), UFD (USB Flash Disk), Mobile Phone, et al. For many Flash Application fields, users always follow the Flash Specification to design their Flash interface circuit. Users try to speed up the Flash speed performance by using faster CPU or any other methodology. Although users do their best, there is a limitation in the Flash Access Timing Specification, on which users must follow to guarantee the Flash Data Access Correctness. However in real usage, there are a lot of margins in the access time. Like usual way in the Intel CPU case (386, 486, . . . ), the CPU operation Clock frequency have been rated in the Specification, but in the real usage, users can use faster Clock frequency (Over Specification) to get better CPU performance. However, the clock adjustment is done by hand, according to the user's specific experience.

A better solution to efficiently improve the performance is still in need under development.

SUMMARY OF THE INVENTION

The invention provides access time adjusting circuit and method for improving the performance for the non-volatile memory device by optimizing the operation clock with respect to one memory being chosen by an user.

The invention provides access time adjusting circuit and method for improving the performance for the non-volatile memory device, in which an optimized operation clock can be obtained by trigger or by automatic adjustment. The variation due to environment factor can also be reduced.

The invention provides an access time adjusting circuit is used in a non-volatile memory to obtain an optimized access time in operation. The circuit includes an access time detecting unit, used to detect a performance status of the non-volatile memory under an operation clock and output the performance status. An access time controlling unit is used to generate at least one adjusting operation clock. Each the adjusting operation clock serves as the operation clock for the non-volatile memory. In addition, the non-volatile memory, the access time controlling unit, and the access time detecting unit are connected to form a detection and adjustment loop, so that an optimized operation clock is determined after checking the at least one adjusting operation clock.

In an embodiment of the invention, for example, the access time controlling unit generates the at least one adjusting operation clock step by step in changing the waveform of the adjusting operation clock.

In an embodiment of the invention, for example, the access time controlling unit comprises:
a clock generator, to generate a reference clock;
a high pulse setting unit, to determine a width for a high voltage level;
a low pulse setting unit, to determine a width for a low voltage level; and
a high-low pulse width generator, coupled with the clock generator, the high pulse setting unit, and the low pulse setting unit, so as to generate the adjusting operation clock according to the widths for the high voltage level and the low voltage level.

In an embodiment of the invention, for example, the clock generator is a programmable clock generator.

In an embodiment of the invention, for example, the access time detecting unit detects the performance status by a software analysis or a hardware analysis. Further for example, the access time detecting unit detects an Error Correction Code (ECC) information in data accessing.

In an embodiment of the invention, for example, the at least one adjusting operation clock is generated step by step with an increasing step from a low operative speed, and the optimized operation clock is determined by choosing back at least one step when the performance status indicates a failure.

In an embodiment of the invention, for example, the at least one adjusting operation clock is generated step by step with a decreasing step from a high inoperative speed, and the optimized operation clock is determined when the performance status indicates a success.

In an embodiment of the invention, for example, the at least one adjusting operation clock is generated step by step under setting rule, so as to determine the optimized operation clock based on the performance status with respect to the at least one adjusting operation clock.

In an embodiment of the invention, for example, the access time detecting unit and the access time controlling unit are activated in an automatic mode for dynamically adjusting the operation clock, or in a triggered mode at any time when the operation clock needs to be adjusting.

The invention further provides an access time adjusting method, used in a non-volatile memory to obtain an optimized access time in operation. The access time adjusting method comprises generating an adjusting operation clock to serve as an operation clock; applying the operation clock to the non-volatile memory; performing a looping check of data accessing error, wherein the adjusting operation clock is generated step by step with a different condition; determining an optimized operation clock after the looping check; and applying the optimized operation clock to the non-volatile memory.

In an embodiment of the invention, for example, in the step of performing the looping check of data accessing error, the adjusting operation clock is L generated step by step by an increasing step, so that the optimized operation clock is determined after at least one failure operation is found.

In an embodiment of the invention, for example, in the step of performing the looping check of data accessing error, the adjusting operation clock is generated step by step by a decreasing step, so that the optimized operation clock is determined after at least one success operation is found.

In an embodiment of the invention, for example, in the step of performing the looping check of data accessing error, an ECC information in data accessing is checked.

In an embodiment of the invention, for example, the method can be set to be in an automatic operation mode or a triggered mode at any time when the operation clock needs to be adjusting.

In an embodiment of the invention, for example, in the step of generating the adjusting operation clock, a waveform of the adjusting operation clock is adjusted.

The present invention propose an circuit or a method to adaptively adjust the operation clock for improving the performance of the memory in different type.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

In the invention, a novel access time adjusting circuit and method is proposed. The invention can be, for example, specifically used in "NAND Type Flash Access Time Control". However, the present invention can generally adjust the access time for a non-volatile memory to improve the performance from the default setting. Several embodiments are provided for describing the features of the invention. However, the invention is not limited to the embodiments.

Figure 1:
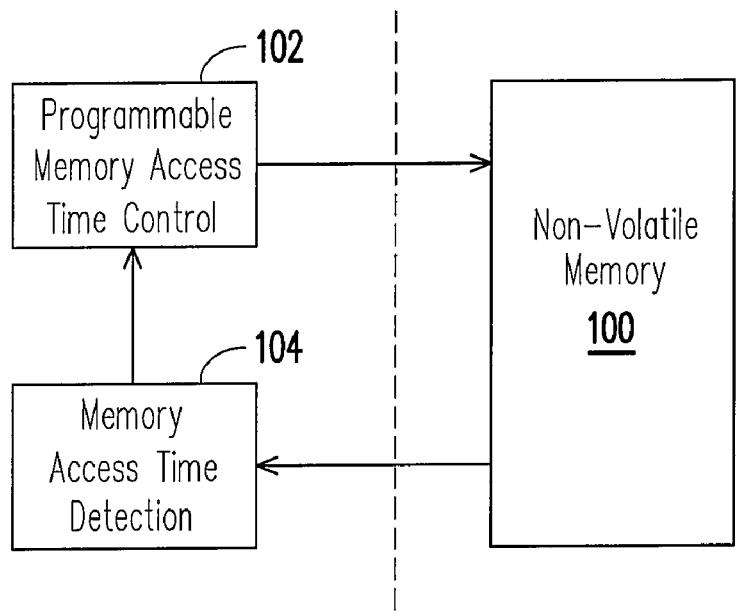
FIG. 1 is a block diagram, schematically illustrating the access time adjusting circuit, according to an embodiment of the invention.

FIG. 1 is a block diagram, schematically illustrating the access time adjusting circuit, according to an embodiment of the invention. In FIG. 1, a non-volatile memory 100, such as the flash memory, basically has the specific operation clock at a relatively lower speed, so as to ensure the memory 100 to be accessed without causing error. However, at this relatively lower speed, the performance of the memory 100 is not at the good condition. Usually, the memory 100 can be operated in faster speed. The invention can optimize the operation clock for the memory, so as to improve the performance of the memory 100.

The access time adjusting circuit of the invention can for example include an access time detecting unit 104 (or called memory access time detection unit), used to detect a performance status of the memory 100 under an operation clock and output the performance status. The memory 100 can be a non-volatile memory, such as flash memory. The memory 100 at the current operation clock or the default operation clock may be not the optimized operation clock. In order to obtain the optimized operation clock under the optimizing rule, an access time controlling unit 102 can be used to generate at least one adjusting operation clock. Each of the adjusting operation clock serves as the operation clock for the non-volatile memory. In other words, the non-volatile memory 100, the access time controlling unit 102, and the access time detecting unit 104 are connected to form a detection and adjustment loop, so that an optimized operation clock is determined after checking the at least one adjusting operation clock.

Figure 2:
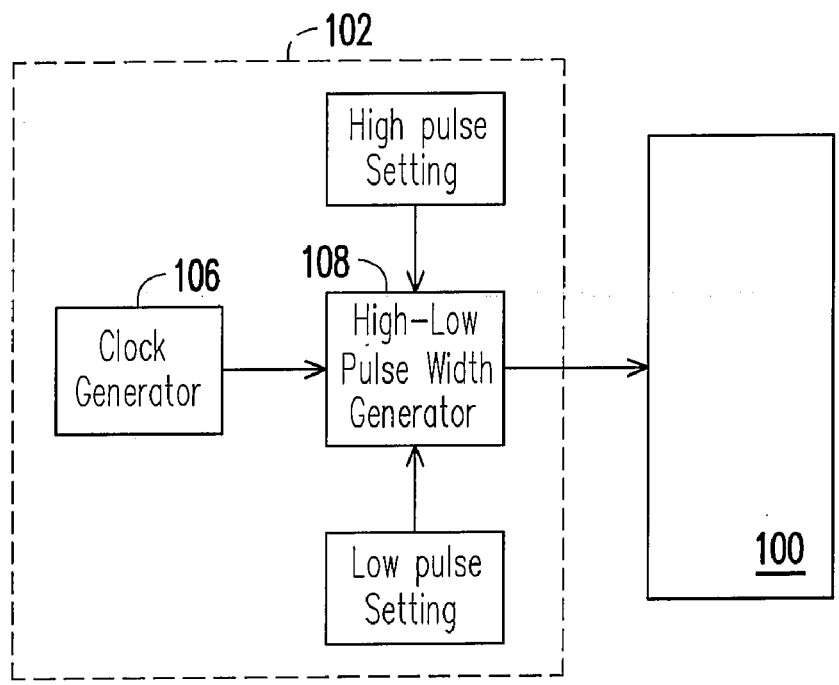
FIG. 2 is a block diagram, schematically illustrating the blocks of the access time controlling unit, according to an embodiment of the invention.

For the access time controlling unit 102, it can be designed in several ways. FIG. 2 is a block diagram, schematically illustrating the blocks of the access time controlling unit, according to an embodiment of the invention. In FIG. 2, for example, the access time controlling unit 102 can include a clock generator 106 and a high-low pulse width generator 108. The clock generator 106 can generate a clock. The frequency of the clock is programmable, for example, by digital phase locked loop (DPLL), analog phase locked loop (APLL), or delay locked loop (DLL). The high-low pulse width generator 108 is used to generate the adjusting operation clock, which usually is asymmetric in the portions of the high voltage level and the low voltage level, that are the widths for the high voltage level and the low voltage level. This waveform would depend on the operation specification of the memory 100 and could still have some margin region to be adjusted to the optimized condition. In addition, in order to changeably set the portions of the high voltage level and the low voltage level, a high pulse setting unit and a low pulse setting unit can be used in coupling with the high-low pulse width generator 108 for setting the waveform. The output of the high-low pulse width generator 108 is, for example, the operation clock with a waveform (i.e. see FIG. 3) having different portions in low level and the high level, and is to be applied to memory 100 in operation.

When the generated clock is applied to the memory 100, a performance can be detected by the access time detecting unit 104. The access time detecting unit 104 can, for example, check the ECC in data accessing operation by software or hardware manner. However, these are not the only ways to check the performance of the memory 100.

Figure 3:
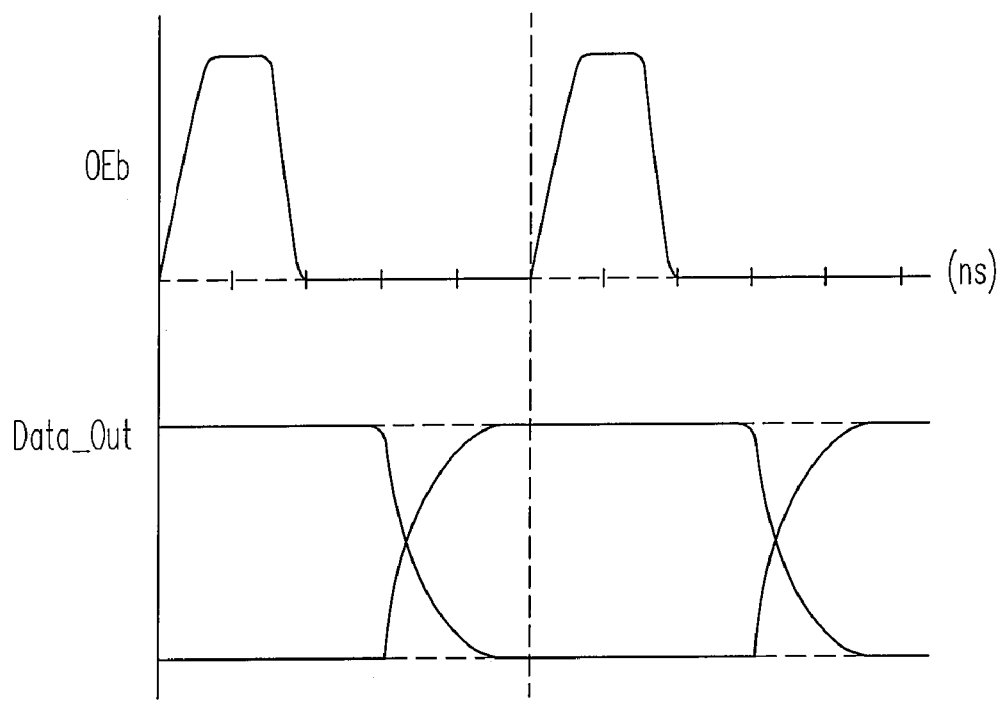
FIG. 3 is a drawing, schematically illustrating a waveform of the operative clock, according to an embodiment of the invention.

FIG. 3 is a drawing, schematically illustrating a waveform of the operative clock, according to an embodiment of the invention. In FIG. 3, the output enable (OEb) signal, as shown in upper part, for example has a cycle of 50 ns. Then, the portion with high level is 15 ns and the portion with low level is 35 ns. The specification of the memory is, for example, a type of low-level activation. In other words, the activating time point is the rising edge of the waveform in each cycle. In The example of FIG. 3, the activating time point is indicated by the dashed line. Then, for example, a read operation is activated to read the data back in "0" or "1", so as to check the correctness. The data_out includes some "0" data and some "1" data in different voltage levels. The drawing is a mixing drawing and can be understood by the person with ordinary skill. It should be noted that, according to the experimental data, the activating time is at the region where the low level and the high level can be successfully sensed with distinguishable condition with respect to the data of "0" or "1". In other words, the data can be correctly read out. This also indicates an acceptable waveform.

To look for the optimized waveform, the cycle, the portion of the high level, the portion of the low level can be changed in the access time detecting unit 104 based on the algorithm being taken. For example, the cycle is reduced by 45 ns while the portion of the low level is adjusted to 30 ns. In this condition, the operation speed is faster from 50 ns to 45 ns in one cycle. Under this algorithm, the cycle, the portion of the high level, the portion of the low level are changed in checking the performance until at one time of failure.

Figure 4:
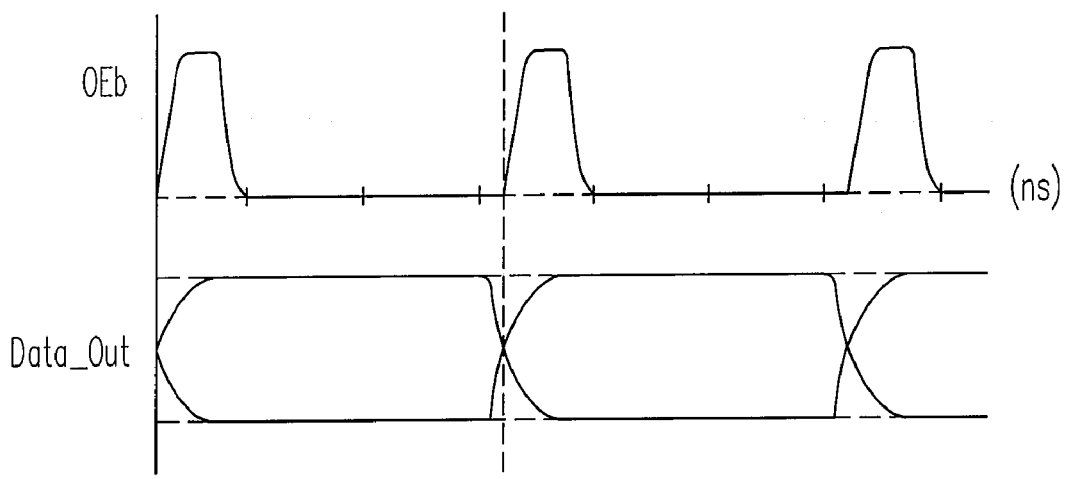
FIG. 4 is a drawing, schematically illustrating a waveform of the inoperative clock, according to an embodiment of the invention.

When the waveform is continuously changed, and an inoperative waveform may occur. FIG. 4 is a drawing, schematically illustrating a waveform of the inoperative clock, according to an embodiment of the invention. For example, the inoperative waveform may occur when the cycle is reduced to 32 ns, the high level is reduced to 8 ns and the low level is reduced to 24 ns. In this situation, the activating time point is at the region where it is hard to distinguish the data of "0' or "1".

The checking algorithm can be set by, for example, varying the three parameters of the cycle, the low-level portion and the high-level portion. After the checking with several waveforms, an optimized operation clock with the successful waveform can be decided. If the operation speed is increasing, then the optimized operation clock can be preferably taken by setting back with, for example, one step backward. However, this is not the only way. The algorithm in optimizing the operation clock can be set according to the actual design. The present is not specifically limited to the way in descriptions. The initial operation clock may preferably take the default clock, according to the minimum requirement of the memory in operation.

Further, if operation clock is set in decreasing direction, the initial operation clock may be set in rather fast clock. In this way, the performance is failure from the beginning. However, when the operation is reduced to a certain level, the performance then is changed to the acceptable condition.

Further, the circuit of the invention can have two modes. For example, the access time detecting unit and the access time controlling unit are activated in an automatic mode for dynamically adjusting the operation clock. This is useful to adjust in accordance with the environment change, such as thermal effect, or any other effect. Alternatively, it can be set in a triggered mode at any time when the operation clock needs to be adjusting.

Figure 5:
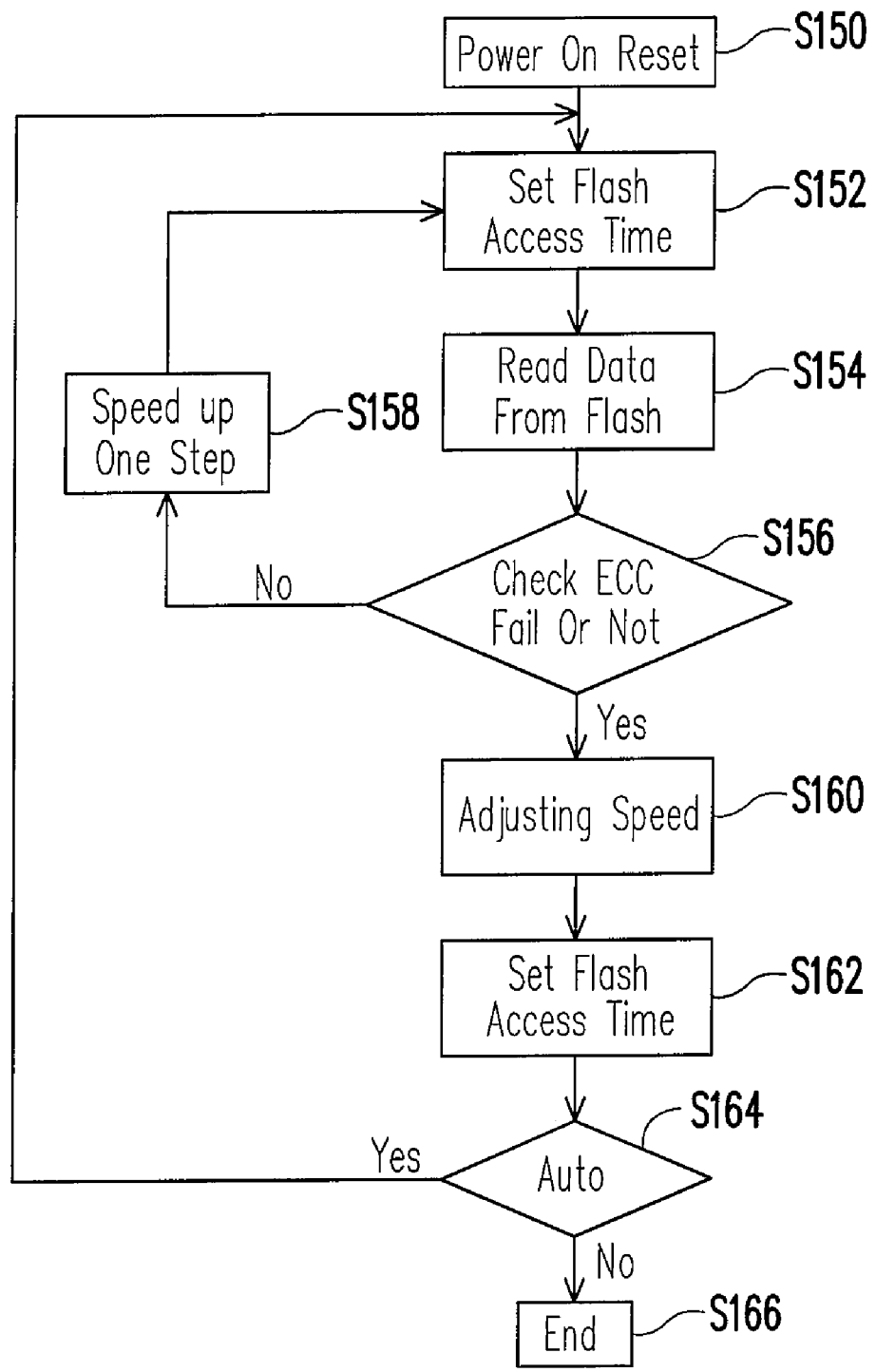
FIG. 5 is a procedure, schematically illustrating the access time adjusting method, according to an embodiment of the invention.

The access time adjusting circuit of the invention, as shown in FIG. 1, is a hardware design. However, in general, the present invention can be a method. FIG. 5 is a procedure, schematically illustrating the access time adjusting method, according to an embodiment of the invention. In FIG. 5, in step S150, when the power of the memory is turned on, an initial clock by the default operation clock may be automatically set. However, it can start from any time with an initial operation clock. In this example, the operation speed is, for example, increasing. The initial operation clock is then applied to the memory 100, such as the Flash, in step S152 for setting the access time. In step S154, for example, the data are read out. Then, in step S156, the error is checked, for example, by checking the ECC to decide whether or not the operation is failure. If the performance is not failure, then for example, the operation speed is one step increasing in step S158 and the procedure goes back to the step S152. Otherwise, if the performance is failure, then the operation speed is set in step S160. For example, preferably, the optimized operation clock can set by taking one step back based on the algorithm of increasing speed. Then, the actual operation clock for the memory is determined in step S162. However, in several checking directions according to three adjusting parameters, at least one time of failure may occur. Then, a faster operation clock may be taken. However, the above descriptions are just the examples, and are not the only choices in setting.

Further for example in one alternative situation, if the adjusting algorithm is in decreasing operation speed, then the initial operation clock may cause the failure, then the previous step S156 may change to check whether or not a success occurs while the step S158 is reducing the speed.

The control procedure in steps S152-S162 may triggered at any time when user wants. However, the procedure can also be step in an automatic check in step S164. If the automatic mode is set, then every a time period, the operation clock is adjust once. For example, the performance change due to the environment thermal effect can be automatically reduced without the worry by the user.

The invention has proposed the circuit and the method to optimize various types of memory. In other words, the invention is adaptive with various types of memory without separate design or setting for different memories.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:

1. An access time adjusting circuit, used to obtain an optimized access time for accessing a non-volatile memory, the circuit comprising:
    an access time detecting unit, for detecting a performance status of accessing the non-volatile memory and output the performance status; and
    an access time controlling unit, for generating an adjusting operation clock which serves as an operation clock for accessing the non-volatile memory, wherein the access time controlling unit comprises:
        a clock generator, for generating a reference clock; and
        a programmable high-low pulse width generator, in conjunction with the clock generator for generating the adjusting operation clock according to widths for a high voltage level and a low voltage level,
    wherein the access time controlling unit and the access time detecting unit are connected to form an adaptive and dynamic detection and adjustment loop, so that an optimized operation clock is determined.

2. The circuit of claim 1, wherein the access time controlling unit generates the adjusting operation clock by changing a high-low pulse width of the adjusting operation clock step by step.

3. The circuit of claim 1, wherein the clock generator is a programmable clock generator.

4. The circuit of claim 1, wherein the clock generator is a locked loop circuit.

5. The circuit of claim 4, wherein the loop lock circuit comprises digital phase locked loop (DPLL), analog phase locked loop (APLL), or delay locked loop (DLL).

6. The circuit of claim 1, wherein the access time detecting unit detects the performance status by a software analysis or a hardware analysis.

7. The circuit of claim 1, wherein the access time detecting unit detects an error check code (ECC) information in data accessing.

8. The circuit of claim 1, wherein the adjusting operation clock is generated from a low operative speed to a high operative speed step by step, and the optimized operation clock is determined by choosing a clock condition in at least one step back when the performance status indicates a failure.

9. The circuit of claim 1, wherein the adjusting operation clock is generated step by step with a decreasing step size from a high inoperative speed, and the optimized operation clock is determined when the performance status indicates a success.

10. The circuit of claim 1, wherein the adjusting operation clock is generated step by step under setting rule, so as to determine the optimized operation clock based on the performance status corresponding to the adjusting operation clock.

11. The circuit of claim 1, wherein the access time detecting unit and the access time controlling unit are activated in an automatic mode for dynamically adjusting the operation clock, or in a triggered mode at any time when the operation clock needs to be adjusting.

12. An access time adjusting method, used in a non-volatile memory to obtain an optimized access time in operation, the access time adjusting method comprising:
   generating an adjusting operation clock to serve as an operation clock;
   applying the operation clock to the non-volatile memory;
   performing a looping check of data accessing error, wherein the adjusting operation clock is generated step by step with a different condition, wherein the adjusting operation clock is generated according to widths in the different condition for a high voltage level and a low voltage level;
   determining an optimized operation clock after the looping check; and
   applying the optimized operation clock to the non-volatile memory.

13. The access time adjusting method of claim 12, wherein in the step of performing the looping check of data accessing error, the adjusting operation clock is generated step by step by an increasing step, so that the optimized operation clock is determined after at least one failure operation is found.

14. The access time adjusting method of claim 12, wherein in the step of performing the looping check of data accessing error, the adjusting operation clock is generated step by step by a decreasing step, so that the optimized operation clock is determined after at least one success operation is found.

15. The access time adjusting method of claim 12, wherein in the step of performing the looping check of data accessing error, an error check code (ECC) information in data accessing is checked.

16. The access time adjusting method of claim 12, further comprising a step to set the method in an automatic operation mode or a triggered mode at any time when the operation clock needs to be adjusting.

17. The access time adjusting method of claim 12, in the step of generating the adjusting operation clock, a waveform of the adjusting operation clock is adjusted.

* * * * *